United States Patent [19]
Ziger

[11] Patent Number: 6,068,955
[45] Date of Patent: May 30, 2000

[54] METHODS OF INSPECTING FOR MASK-DEFINED, FEATURE DIMENSIONAL CONFORMITY BETWEEN MULTIPLE MASKS

[75] Inventor: David Ziger, San Antonio, Tex.

[73] Assignee: VLSI Technology, Inc., Sunnyvale, Calif.

[21] Appl. No.: 09/273,077

[22] Filed: Mar. 19, 1999

[51] Int. Cl.⁷ .................................................. G03F 9/00
[52] U.S. Cl. ........................... 430/30; 382/144; 382/145; 382/149; 382/151
[58] Field of Search .............................. 430/30; 382/144, 382/145, 149, 151

[56] References Cited

U.S. PATENT DOCUMENTS 5,750,990  5/1998  Mizuno et al. .......................... 250/307
5,798,193  8/1998  Pierrat et al. ............................ 430/30

*Primary Examiner*—Christopher G. Young
*Attorney, Agent, or Firm*—Wells, St. John, Roberts, Gregory & Matkin, PS

[57] ABSTRACT

Methods of inspecting for mask-defined, feature dimensional conformity between multiple masks which are utilized in lithographic processing are described. In one embodiment, a first mask having a first reference artifact thereon is exposed to conditions effective to transfer the first reference artifact onto a coated substrate. A second mask having a second reference artifact thereon is exposed to conditions effective to transfer the second reference artifact onto the coated substrate. The first and second reference artifacts are inspected to ascertain whether the second reference artifact is within desirable dimensional tolerances relative to the first reference artifact. In a preferred embodiment, the first and second reference artifacts contain at least one feature which defines a critical dimension of a photolithographic process utilized to form the artifacts.

35 Claims, 3 Drawing Sheets

METHODS OF INSPECTING FOR MASK-DEFINED, FEATURE DIMENSIONAL CONFORMITY BETWEEN MULTIPLE MASKS

TECHNICAL FIELD

This invention pertains to methods of inspecting for mask-defined, feature dimensional conformity between multiple masks which are utilized in lithographic processing. In particular, the invention concerns inspecting for critical dimension (CD) conformity between multiple masks which are utilized in lithographic processing.

BACKGROUND OF THE INVENTION

Along with the development of semiconductor technology, the VLSI process has advanced toward the deep submicron field. Accordingly, the line width, line space, and the size of contact holes have all shrunk such that controlling the dimensions of the semiconductor devices, and in particular, the critical dimensions, is more difficult than ever.

To make the fabrication process for VLSI stable and reliable, it is very important to keep the deviations of the critical dimensions within a tolerant range. In order to meet such requirements, the process parameters must be set up by practical CD experiments. Therefore, CD structures, such as verniers and the like, are designed for use with automated inspection tools such as scanning electron microscopes (SEMs) to assure that real pattern CD values are within the acceptable range of designed targeted CD values.

Fabrication of VLSI devices typically involves the use of a plurality of masks which define circuit features thereon. Maintaining the dimensional conformity between defined circuit features on such masks is highly desirable. For example, maintaining the critical dimensions as between multiple masks is essentially required in order to ensure that the ultimately-formed integrated circuitry is standard in its performance and operation.

One way that mask-defined features have been checked for dimensional conformity in the past has involved inspecting each subsequently rendered mask image for its specific feature dimensions to ensure compliance with particular design parameters. This process is particularly time-consuming because each rendered mask image must be checked. This can increase processing time and thereby decrease throughput.

Accordingly, this invention arose out of concerns associated with improving the methods by which integrated circuitry is formed. In particular, this invention arose out of concerns associated with improving methods for inspecting for mask-defined, feature dimensional conformity between multiple masks.

SUMMARY OF THE INVENTION

Methods of inspecting for mask-defined, feature dimensional conformity between multiple masks which are utilized in lithographic processing are described.

In one embodiment, a first mask having a first reference artifact thereon is exposed to conditions effective to transfer the first reference artifact onto a coated substrate. A second mask having a second reference artifact thereon is exposed to conditions effective to transfer the second reference artifact onto the coated substrate. The first and second reference artifacts are inspected to ascertain whether the second reference artifact is within desirable dimensional tolerances relative to the first reference artifact. In a preferred embodiment, the first and second reference artifacts contain at least one feature which defines a critical dimension of a photolithographic process utilized to form the artifacts.

In another embodiment, a first mask is used to form at least one exposed region over a substrate. The exposed region preferably has a reference structure therewithin. A second mask is used to form at least one exposed region over the substrate having a second reference structure which is similar in appearance to the first reference structure. Using an automated inspection tool, the first and second reference structures are inspected to ascertain whether one of the first and second reference structures is in dimensional conformity with the other of the first and second reference structures.

In yet another embodiment, a plurality of first alignment artifacts is formed over a substrate, with individual first alignment artifacts being spaced apart a first predefined distance. In a separate processing step, a plurality of second alignment artifacts is formed over the substrate. Individual second alignment artifacts are spaced apart a second predefined distance. The first and second alignment artifacts are inspected to ascertain whether individual first and second alignment artifacts are within desired dimensional tolerances of one another. In a preferred embodiment, at least one, and preferably both of the first alignment artifacts are formed in a step-and-repeat fashion. In another embodiment, formation of the first and second alignment artifacts comprises using different masks.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

In accordance with various embodiments of the present invention, methods of inspecting for mask-defined, feature dimensional conformity between multiple masks which are utilized in lithographic processing are described. The context in which these various embodiments can be used include, without limitation, processing scenarios where a first mask is used to define a circuit pattern, and then modified in some manner, to define a modified circuit pattern. Various embodiments of the invention can provide assurances that desirable dimensional aspects of the unmodified mask are preserved in the modified mask. In other processing scenarios, various embodiments of the invention can be used in the context of two or more entirely different masks. Such will become more evident in view of the discussion just below.

Figure 1:
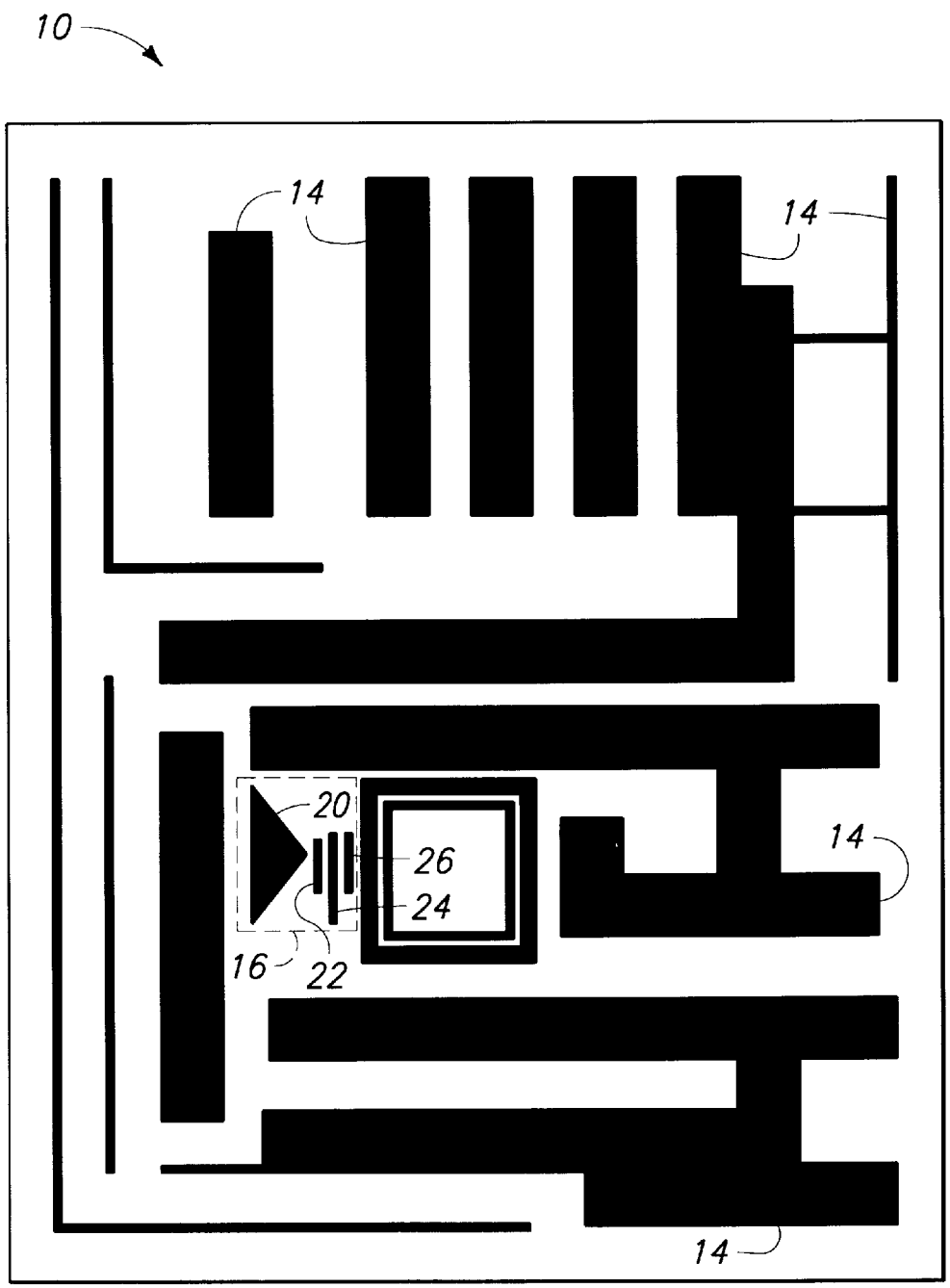
FIG. 1 is a top plan view of an exemplary mask in accordance with one embodiment of the invention.
Figure 2:
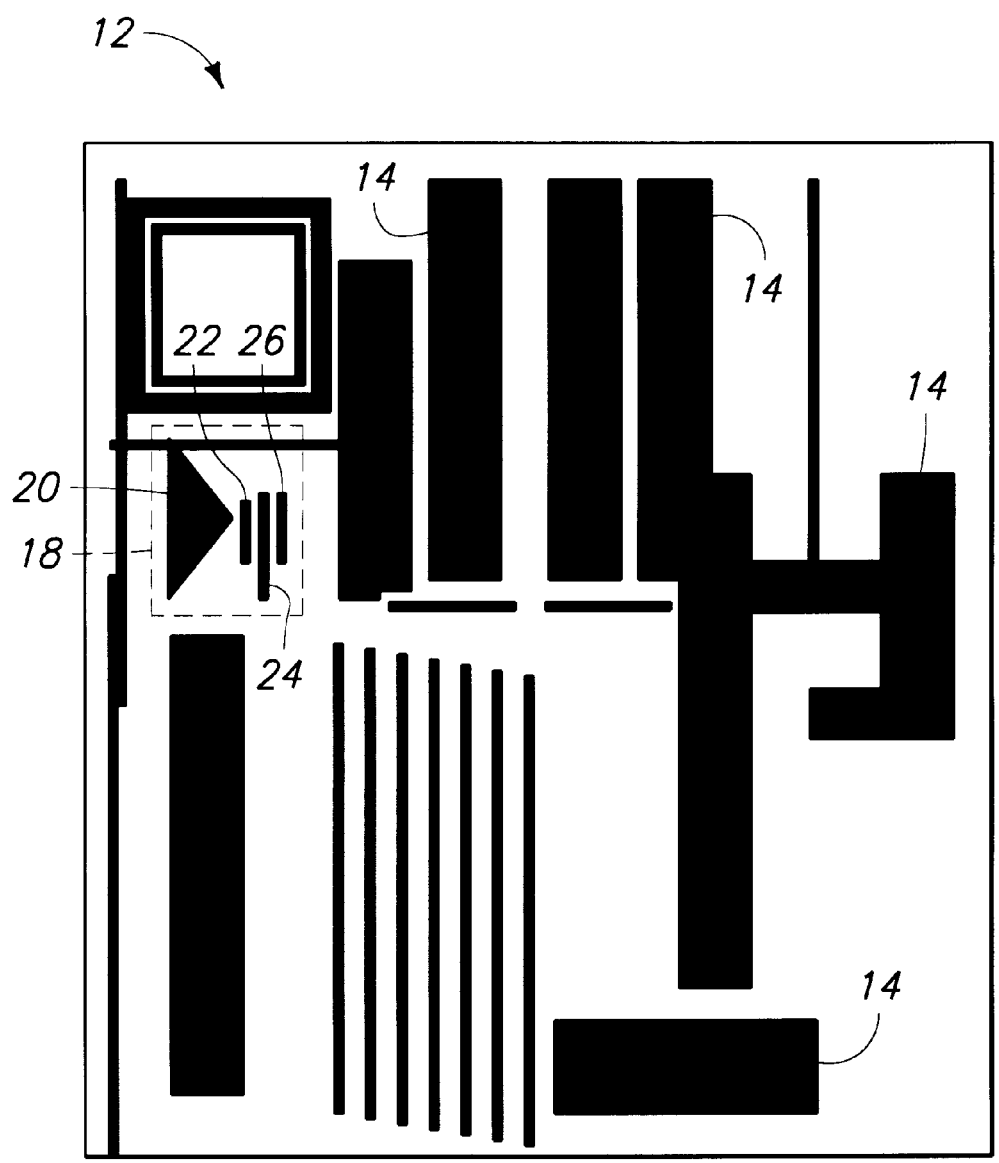
FIG. 2 is a top plan view of an exemplary mask in accordance with another embodiment of the present invention.

Referring to FIGS. 1 and 2, respective masks are shown generally at 10 and 12. Masks 10, 12 are preferably configured for use in lithographic processing, such as photolithography, to form integrated circuit patterns over a substrate which is coated with a masking material such as photoresist. Each mask includes integrated circuit patterns which are simply represented with the reference numeral 14 in each figure. The particular type of circuit pattern defined by circuit patterns 14 is not germane to a discussion of the various inventive embodiments of the present invention. Accordingly, any suitable circuit patterns can be defined by masks 10, 12. And, although masks 10, 12 represent different masks, the various embodiments of the present invention can be used where masks 10, 12 are identical.

Continuing, and in one embodiment, each mask is provided with a reference artifact 16, 18 respectively. For purposes of the ongoing discussion, mask 10 can be considered as a first mask having a first reference artifact 16, and mask 12 can be considered as a second mask having a second reference artifact 18 thereon. In one embodiment, the first and second reference artifacts 16, 18, on their respective masks 10, 12, are similar in appearance. In another embodiment, reference artifacts 16, 18, on their respective masks 10, 12, are identical in appearance. In yet another embodiment, the first and second reference artifacts 16, 18 contain at least one feature which defines a critical dimension of a photolithographic process which is utilized to form the artifacts. For example, and using reference artifact 16 in FIG. 1, such contains four features 20, 22, 24, and 26. At least one, and preferably more of the features define a critical dimension. In this example, features 22, 24, and 26 can be used to define the critical dimension. Feature 20 can be used, in some embodiments, and as will become apparent below, by automated inspection tools for the purpose of recognizing where on a particular exposed pattern, the reference artifact appears. Exemplary methods for measuring critical dimensions are disclosed in U.S. Pat. Nos. 5,750,990, and 5,847,818, the disclosures of which are incorporated by reference herein.

Figure 3:
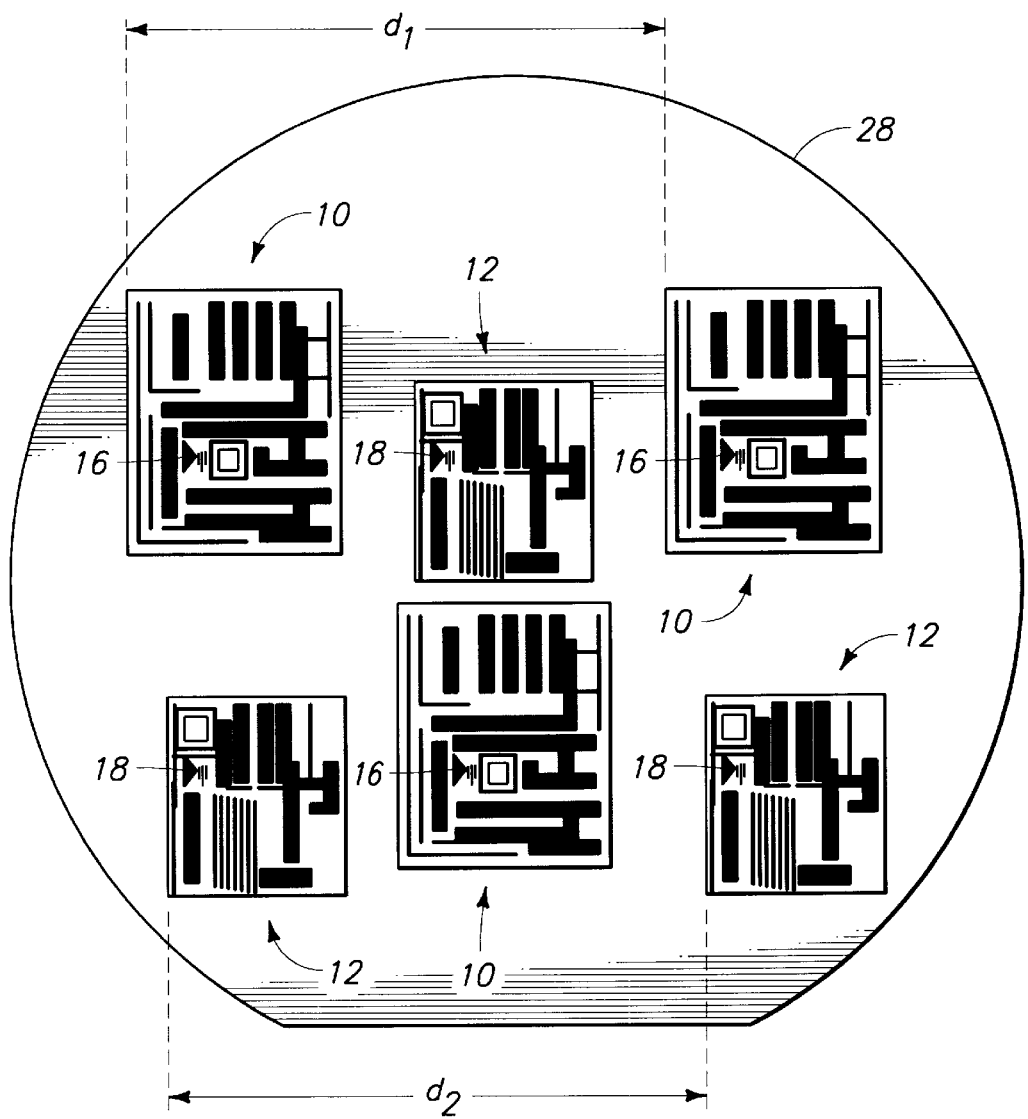
FIG. 3 is a top plan view of a semiconductor wafer having exposed thereon the masks of FIGS. 1 and 2 in accordance with at least one embodiment of the invention.

Referring to FIGS. 1, 2, and 3, first mask 10 having a first reference artifact 16 is exposed to conditions effective to transfer the first reference artifact onto a coated substrate such as wafer 28. Substrate 28 is preferably coated with a masking material such as photoresist. Second mask 12 having a second reference artifact 18 is exposed to conditions effective to transfer the second reference artifact 18 onto coated substrate 28. After the transfer of the first and second reference artifacts, the artifacts are preferably inspected to ascertain whether the second artifact 18 is within desirable dimensional tolerances relative to the first reference artifact.

In this example, assume that first reference artifact 16 (and hence the integrated circuitry pattern defined thereby) has been proven to be within desirable dimensional tolerances, e.g. critical dimensions, insofar as the photolithographic process which is utilized to form the artifact. Assume also, that it is desirable to provide the circuit patterns defined by mask 12 (not only reference artifact 18) within the same desired tolerance parameters as those defined by mask 10. Accordingly, and by virtue of the fact that a common substrate is used during exposure of the masks, along with a common exposure tool, any variances in the dimensions of the ultimately rendered circuit patterns of mask 12 can be determined by variances in its reference artifact 18 as compared with reference artifact 16. These variances can be largely attributed to defects or variances in the mask-defined circuit patterns of mask 12 themselves, and not variances in the processing utilized to form such patterns. Hence, by using one wafer or substrate, one exposure tool, and a common reference artifact on two different masks, the process engineer can, in a very short period of time confirm whether the circuit patterns defined on one or more different additional masks are within desired tolerance parameters.

In another embodiment, the exposing of first mask 10 comprises exposing the first mask a plurality of times in a step-and-repeat fashion having a step-and-repeat distance. For example, a wafer stepper can be used to effect exposure of the first mask in a known manner. In FIG. 3, for example, first mask 10 has been exposed in a step-and-repeat fashion having a step-and-repeat distance $d_1$. In another embodiment, the exposing of second mask 12 comprises exposing the second mask a plurality of times in a step-and-repeat fashion having a step-and-repeat distance. In FIG. 3 again, for example, the bottom row has mask 12 exposed twice having a step-and-repeat distance $d_2$. In a preferred embodiment, step-and-repeat distances $d_1$ and $d_2$ are the same in magnitude.

In another preferred embodiment, the exposing of the first and second masks comprising placing the masks over the substrate in respective positions to transfer the first and second reference artifacts 16, 18 onto the substrate to be generally on pitch with one another. Having the reference artifacts generally on pitch with one another carries with it additional advantages that an automatic SEM job can be created to measure the dimensional conformity between the different masks via the reference artifacts. In a preferred embodiment, one SEM job can be created to measure the critical dimensions of the rendered artifacts. Since the SEM alignment target (reference artifacts) and critical dimension structures are at the same step-and-repeat distance as features exposed with the reference mask, no new SEM job is required. This greatly facilitates inspection of multiple masks and can greatly increase throughput.

In another embodiment, a first mask 10 (FIG. 1) is used to form at least one exposed region 10 (FIG. 3) over a substrate. For purposes of explaining this embodiment, reference numerals describing the masks of FIGS. 1 and 2 are also used to describe the respective rendered exposed regions of FIG. 3. First mask 10 preferably has a first reference structure 16. A second mask 12 (FIG. 2), is used to form at least one exposed region 12 (FIG. 3) over the substrate. Second mask 12 has a second reference structure 18 which is similar in appearance, and preferably identical in appearance, to the first reference structure 16. Preferably, an automated inspection tool is used and the first and second reference structures are inspected to ascertain whether one of the first and second reference structures is in dimensional conformity with the other of the first and second reference structures. Processing for ascertaining dimensional conformity can take place using known techniques, some of which are described in the patents incorporated by reference above.

In one embodiment, the first mask is used to form a plurality of exposed regions which are separated by at least one open region. In the illustrated example of FIG. 3, an open region is defined between the two exposed regions 10 appearing in the upper row, prior to utilization of the second mask. The second mask 12 is then used to form at least one exposed region 12 within the open region between masks 10. In another embodiment, the first mask 10 is used to form a plurality of exposed regions, at least some of which being separated from an adjacent exposed region by an open region. Such would correspond to the substrate of FIG. 3 prior to forming exposed regions 12. The second mask is then used to form a plurality of exposed regions, with individual exposed regions of second mask 12 being formed within the individual open regions defined by mask 10.

In another embodiment, each reference structure 16, 18, contains at least one feature which defines a critical dimension of a lithographic process utilized to form the reference structure. In one preferred embodiment, the lithographic process is a photolithographic process. In the illustrated example, three such features are shown in FIG. 1 at 22, 24, and 26. In one embodiment, the first and second reference structures 16, 18, on their respective masks, are similar in appearance. In another embodiment, the first and second reference structures 16, 18, on their respective masks, are identical in appearance.

Preferably, use of first mask 10 comprises exposing the first mask in a step-and-repeat fashion having a first step-and-repeat distance $d_1$ which forms a plurality of exposed regions. The exposed regions are preferably separated from an adjacent exposed region by an open region. In this embodiment, use of the second mask comprises using the mask in a step-and-repeat fashion having a second step-and-repeat distance $d_2$ and forming individual exposed regions of the second mask within individual open regions defined by mask 10. Preferably, the first and second step-and-repeat distances are the same in magnitude. In one embodiment, use of the automated inspection tool comprises using a scanning electron microscope.

In another embodiment, a plurality of first alignment artifacts 16 is formed over a substrate, as in FIG. 3. The individual first alignment artifacts 16 are preferably spaced apart a first predefined distance. In a separate processing step, and preferably using a different mask, a plurality of second alignment artifacts 18 are formed over the substrate. Individual second alignment artifacts 18 are spaced apart a second predefined distance. Preferably, the first and second predefined distances are generally the same in magnitude. The first and second alignment artifacts are inspected to ascertain whether individual first and second alignment artifacts are within desired dimensional tolerances of one another. In one embodiment, formation of the first alignment artifacts 16 comprises doing so in a step-and-repeat fashion. In another embodiment, formation of the second alignment artifacts comprises doing so in a step-and-repeat fashion. In another embodiment, formation of both the first and second alignment artifacts comprises doing so in a step-and-repeat fashion.

Preferably, the first alignment artifacts 16 each contain at least one feature which defines a critical dimension of a photolithographic process utilized to form the first alignment artifacts. In another embodiment, the second alignment artifacts each contain at least one feature which defines a critical dimension of a photolithographic process utilized to form the second alignment artifacts. Preferably, both the first and second alignment artifacts each contain at least one feature which defines a critical dimension of a photolithographic process utilized to form the second alignment artifacts. In one embodiment, inspection of the alignment artifacts is carried out using an automated inspection tool to do so. Preferably, the automated inspection tool comprises a scanning electron microscope.

Advantages of various embodiments of the present invention include that any new mask can be substituted by providing that the stepper job used to expose the second mask is offset so that the SEM artifact and CD structure are in the same relative positions as the reference. Moreover, since the masks are exposed on the same wafer, wafer-to-wafer variations can be eliminated. In addition, since the same SEM job is used, no bias or inaccuracies are inadvertently introduced by creating SEM jobs at two different times. In addition, various embodiments of the invention can be used in connection with more than two masks.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of inspecting for mask-defined, feature dimensional conformity between multiple masks which are utilized in lithographic processing comprising:

exposing a first mask having a first reference artifact thereon to conditions effective to transfer the first reference artifact onto a coated substrate;

exposing a second mask having a second reference artifact thereon to conditions effective to transfer the second reference artifact onto the coated substrate; and inspecting the first and second reference artifacts and ascertaining therefrom whether the second reference artifact is within desirable dimensional tolerances relative to the first reference artifact.

2. The method of claim 1, wherein the first and second reference artifacts, on their respective masks, are similar in appearance.

3. The method of claim 1, wherein the first and second reference artifacts, on their respective masks, are identical in appearance.

4. The method of claim 1, wherein the first and second reference artifacts contain at least one feature which defines a critical dimension of a photolithographic process utilized to form the artifacts.

5. The method of claim 1, wherein the exposing of the first mask comprises exposing the first mask a plurality of times in a step-and-repeat fashion having a step-and-repeat distance.

6. The method of claim 1, wherein the exposing of the second mask comprises exposing the second mask a plurality of times in a step-and-repeat fashion having a step-and-repeat distance.

7. The method of claim 1, wherein:

the exposing of the first mask comprises exposing the first mask a plurality of times in a step-and-repeat fashion having a first step-and-repeat distance; and the exposing of the second mask comprises exposing the second mask a plurality of times in a step-and-repeat fashion having a second step-and-repeat distance, the first and second step-and-repeat distances being the same in magnitude.

8. The method of claim 1, wherein the first and second reference artifacts, on their respective masks, are generally identical in appearance, and wherein the exposing of the first and second masks comprises placing the masks over the substrate in respective positions to transfer the first and second reference artifacts onto the substrate to be generally on pitch with one another.

9. The method of claim 1, wherein:

the first and second reference artifacts, on their respective masks, are generally identical in appearance;

the exposing of the first mask comprises exposing the first mask a plurality of times in a step-and-repeat fashion having a first step-and-repeat distance; and the exposing of the second mask comprises exposing the second mask a plurality of times in a step-and-repeat fashion having a second step-and-repeat distance, the first and second step-and-repeat distances being the same in magnitude.

10. The method of claim 9, wherein the first and second reference artifacts contain at least one feature which defines a critical dimension of a photolithographic process utilized to form the artifacts.

11. A method of inspecting for mask-defined, feature dimensional conformity between multiple masks which are utilized in lithographic processing comprising:

using a first mask, forming at least one exposed region over a substrate having a first reference structure;

using a second mask, forming at least one exposed region over the substrate having a second reference structure which is similar in appearance to the first reference structure; and using an automated inspection tool, inspecting the first and second reference structures to ascertain whether one of the first and second reference structures is in dimensional conformity with the other of the first and second reference structures.

12. The method of claim 11, wherein:

the using of the first mask comprises forming a plurality of exposed regions separated by at least one open region; and the using of the second mask comprises forming said at least one exposed region within an open region.

13. The method of claim 11, wherein:

the using of the first mask comprises forming a plurality of exposed regions some of which being separated from an adjacent exposed region by an open region; and the using of the second mask comprises forming a plurality of exposed regions, individual exposed regions of the second mask being formed within individual open regions.

14. The method of claim 11, wherein each reference structure contains at least one feature which defines a critical dimension of a photolithographic process utilized to form the reference structure.

15. The method of claim 11, wherein:

the using of the first mask comprises forming a plurality of exposed regions separated by at least one open region;

the using of the second mask comprises forming said at least one exposed region within an open region; and each reference structure contains at least one feature which defines a critical dimension of a photolithographic process utilized to form the reference structure.

16. The method of claim 11, wherein:

the using of the first mask comprises forming a plurality of exposed regions at least some of which being separated from an adjacent exposed region by an open region;

the using of the second mask comprises forming a plurality of exposed regions, individual exposed regions of the second mask being formed within individual open regions; and each reference structure contains at least one feature which defines a critical dimension of a photolithographic process utilized to form the reference structure.

17. The method of claim 11, wherein the first and second reference structures, on their respective masks, are similar in appearance.

18. The method of claim 11, wherein the first and second reference structures, on their respective masks, are identical in appearance.

19. The method of claim 11, wherein:

the using of the first mask comprises exposing the first mask in a step-and-repeat fashion having a first step-and-repeat distance and forming a plurality of exposed regions at least some of which being separated from an adjacent exposed region by an open region; and the using of the second mask comprises exposing the second mask in a step-and-repeat fashion having a second step-and-repeat distance and forming individual exposed regions of the second mask within individual open regions.

20. The method of claim 19, wherein the first and second step-and-repeat distances are the same in magnitude.

21. The method of claim 11, wherein the using of the automated inspection tool comprises using a scanning electron microscope.

22. A method of inspecting for mask-defined, feature dimensional conformity between multiple masks which are utilized in lithographic processing comprising:

forming a plurality of first alignment artifacts over a substrate, individual first alignment artifacts being spaced apart a first predefined distance;

in a separate processing step, forming a plurality of second alignment artifacts over the substrate, individual second alignment artifacts being spaced apart a second predefined distance; and inspecting the plurality of first and second alignment artifacts to ascertain whether individual first and second alignment artifacts are within desired dimensional tolerances of one another.

23. The method of claim 22, wherein the forming of the plurality of first alignment artifacts comprises doing so in a step-and-repeat fashion.

24. The method of claim 22, wherein the forming of the plurality of second alignment artifacts comprises doing so in a step-and-repeat fashion.

25. The method of claim 22, wherein the forming of the plurality of first and second alignment artifacts comprises using different masks.

26. The method of claim 22, wherein:

the forming of the plurality of first alignment artifacts comprises doing so in a step-and-repeat fashion; and the forming of the plurality of second alignment artifacts comprises doing so in a step-and-repeat fashion.

27. The method of claim 22, wherein the first alignment artifacts each contain at least one feature which defines a critical dimension of a photolithographic process utilized to form the first alignment artifacts.

28. The method of claim 22, wherein the second alignment artifacts each contain at least one feature which defines a critical dimension of a photolithographic process utilized to form the second alignment artifacts.

29. The method of claim 22, wherein:

the first alignment artifacts each contain at least one feature which defines a critical dimension of a photolithographic process utilized to form the first alignment artifacts; and the second alignment artifacts each contain at least one feature which defines a critical dimension of a photolithographic process utilized to form the second alignment artifacts.

30. The method of claim 22, wherein:

the forming of the plurality of first alignment artifacts comprises doing so in a step-and-repeat fashion, and wherein the first alignment artifacts each contain at least one feature which defines a critical dimension of a photolithographic process utilized to form the first alignment artifacts; and the forming of the plurality of second alignment artifacts comprises doing so in a step-and-repeat fashion, wherein the second alignment artifacts each contain at least one feature which defines a critical dimension of a photolithographic process utilized to form the second alignment artifacts.

31. The method of claim 22, wherein:

the forming of the plurality of first alignment artifacts comprises doing so in a step-and-repeat fashion, and wherein the first alignment artifacts each contain at least one feature which defines a critical dimension of a photolithographic process utilized to form the first alignment artifacts; and the forming of the plurality of second alignment artifacts comprises doing so in a step-and-repeat fashion, wherein the second alignment artifacts each contain at least one feature which defines a critical dimension of a photolithographic process utilized to form the second alignment artifacts; and further wherein the first and second predefined distances are generally the same in magnitude.

32. The method of claim 22, wherein the inspecting of the plurality of first and second alignment artifacts comprises using an automated inspection tool to do so.

33. The method of claim 22, wherein the inspecting of the plurality of first and second alignment artifacts comprises using a scanning electron microscope to do so.

34. The method of claim 22, wherein:

the forming of the plurality of first alignment artifacts comprises doing so in a step-and-repeat fashion, and wherein the first alignment artifacts each contain at least one feature which defines a critical dimension of a photolithographic process utilized to form the first alignment artifacts;

the forming of the plurality of second alignment artifacts comprises doing so in a step-and-repeat fashion, wherein the second alignment artifacts each contain at least one feature which defines a critical dimension of a photolithographic process utilized to form the second alignment artifacts; and the inspecting of the plurality of first and second alignment artifacts comprises using an automated inspection tool to do so.

35. The method of claim 34, wherein the automated inspection tool comprises a scanning electron microscope.

* * * * *